United States Patent
Chang et al.

(10) Patent No.: US 9,515,234 B2
(45) Date of Patent: Dec. 6, 2016

(54) LED PACKAGE AND MANUFACTURING METHOD THEREOF

(71) Applicant: ADVANCED OPTOELECTRONIC TECHNOLOGY, INC., Hsinchu Hsien (TW)

(72) Inventors: Chung-Min Chang, Hsinchu (TW); Chien-Lin Chang-Chien, Hsinchu (TW); Ya-Ting Wu, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/821,308

(22) Filed: Aug. 7, 2015

(65) Prior Publication Data

US 2016/0064629 A1    Mar. 3, 2016

(30) Foreign Application Priority Data

Aug. 29, 2014 (CN) .......................... 2014 1 0434139

(51) Int. Cl.
| | |
|---|---|
| *H01L 33/00* | (2010.01) |
| *H01L 21/00* | (2006.01) |
| *H01L 33/54* | (2010.01) |
| *H01L 33/48* | (2010.01) |
| *H01L 33/52* | (2010.01) |
| *H01L 33/56* | (2010.01) |
| *H01L 33/50* | (2010.01) |
| *H01L 25/075* | (2006.01) |

(52) U.S. Cl.
CPC ........... *H01L 33/54* (2013.01); *H01L 25/0753* (2013.01); *H01L 33/483* (2013.01); *H01L 33/486* (2013.01); *H01L 33/50* (2013.01); *H01L 33/52* (2013.01); *H01L 33/56* (2013.01); *H01L 2224/48091* (2013.01); *H01L 2933/005* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 2012/0025214 A1* | 2/2012 | Ruan et al. | H01L 33/54 257/88 |
| 2012/0025241 A1* | 2/2012 | Xiao et al. | H01L 33/486 257/98 |
| 2012/0100646 A1* | 4/2012 | Chan et al. | H01L 33/50 438/27 |
| 2015/0014720 A1* | 1/2015 | Tien | H01L 33/20 257/98 |
| 2016/0141462 A1* | 5/2016 | Ling et al. | H01L 33/502 257/98 |

* cited by examiner

*Primary Examiner* — Minh-Loan Tran
(74) *Attorney, Agent, or Firm* — Zhigang Ma

(57) ABSTRACT

A light emitting diode package includes a substrate, several light emitting diodes mounted on the substrate, and a package member enveloping the light emitting diodes. The light emitting diodes are electrically coupled to the substrate. The package member includes at least two layers, the first layer and the second layer. The first layer is spread on the substrate and completely covers the light emitting diodes and the wires. The second layer is formed on the first layer. Fluidity of colloid forming the second layer is worse than that of the first layer. A method is also provided to manufacture the present light emitting diode package.

20 Claims, 5 Drawing Sheets

LED PACKAGE AND MANUFACTURING METHOD THEREOF

FIELD

The disclosure relates to a semiconductor package structure, and particularly relates to a light emitting diode package and manufacturing method thereof.

BACKGROUND

There are a variety of package ways for light emitting diodes, such as chip on board (COB) package. COB package is obtained by mounting a light emitting chip on a printed circuit board and further coating the light emitting chip with resin. The resin has good waterproofing quality and prevents moisture and dust from infiltrating into the light emitting diode package.

BRIEF DESCRIPTION OF THE DRAWINGS

Implementations of the present technology will now be described, by way of example only, with reference to the attached figures.

DETAILED DESCRIPTION

Figure 1:
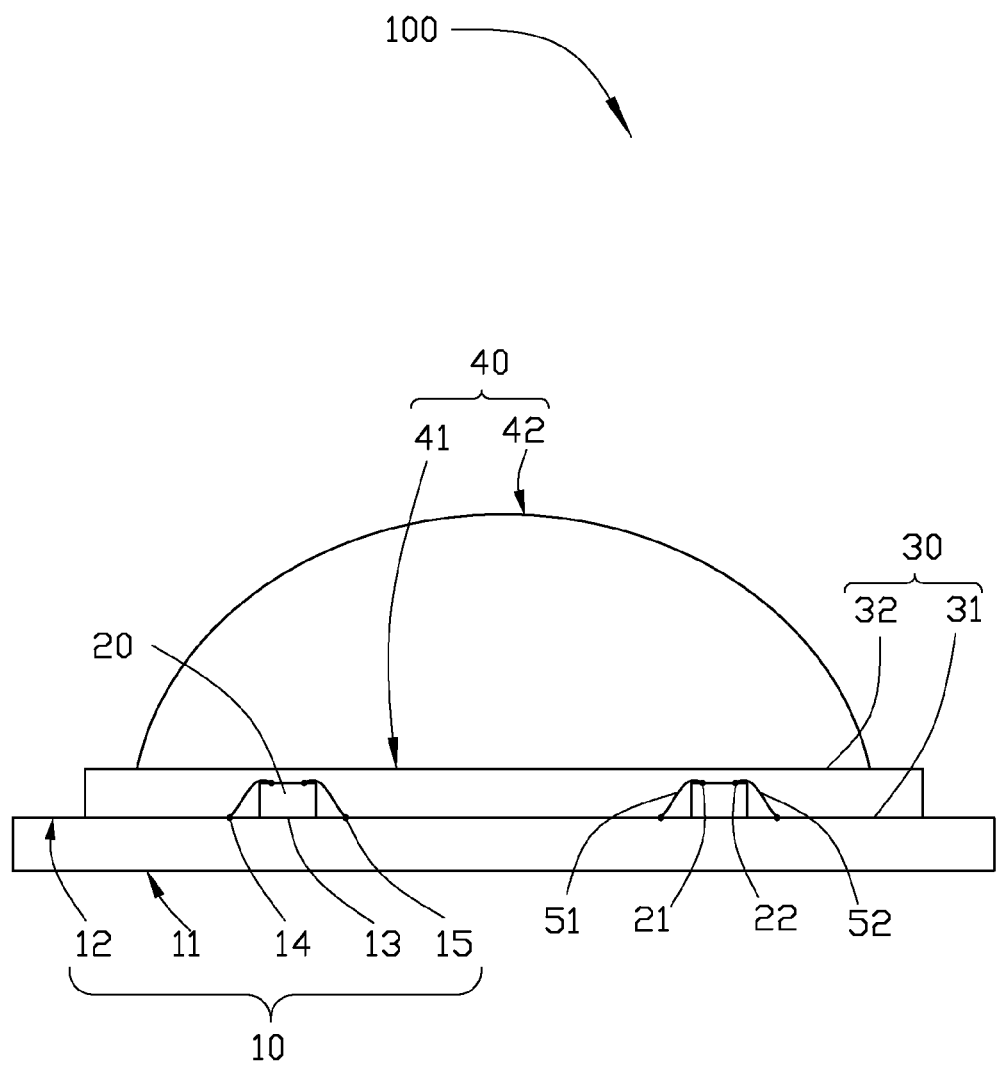
FIG. 1 is a cross-section view of a light emitting diode package in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

Referring to FIG. 1, a light emitting diode package 100 in the present disclosure includes a substrate 10, a plurality of light emitting diodes 20 mounted on the substrate 10, and a package member. In this exemplary embodiment, the package member includes two layers. The two layers are named as a first layer 30 and a second layer 40. The first layer 30 and the second layer 40 are formed on the substrate 10 in sequence. The first layer 30 is configured to cover the light emitting diodes 20. The second layer 40 is formed on the first layer 30.

The substrate 10 is a board with a conductive circuit (not shown), such as a ceramic substrate, a metal substrate, a PLCC and so on. The substrate 10 is flat. The substrate 10 includes a bottom surface 11 and a top surface 12 opposite to the bottom surface 11. The top surface 12 is used for carrying the light emitting diodes 20. A plurality of bonding areas 13, first electrodes 14 and second electrodes 15 are configured on the top surface 12. A number of the first/second electrodes 14/15 is equal to that of the bonding areas 13. Each first electrode 14 and a corresponding second electrode 15 are fixed on two sides of a corresponding bonding area 13, respectively.

Each light emitting diode 20 includes a P-type electrode 21 and an N-type electrode 22. The light emitting diodes 20 are fixed on the bonding areas 13 respectively. The P-type electrode 21 of the light emitting diode 20 is electrically connected to the first electrode 14 of the substrate 10 through a wire 51. The N-type electrode 22 of the light emitting diode 20 is electrically connected to the second electrode 15 of the substrate 10 through a wire 52. The wires 51 and 52 can be selected from copper, gold and other appropriate metal material. In this exemplary embodiment, the wires 51 and 52 are gold wire.

The first layer 30 is formed on the top surface 12 of the substrate 10. The first layer 30 covers the light emitting diodes 20 and wires 51, 52 completely. The first layer 30 is spread on the top surface 12. The first layer 30 includes a pasting surface 31 and a supporting surface 32. The pasting surface 31 is attached on the substrate 10. The supporting surface 32 is used for supporting the second layer 40. In this exemplary embodiment, the supporting surface 32 is flat. In other embodiments, the supporting surface 32 can also be a concave cured surface recessed toward the substrate 10.

The second layer 40 is formed on the supporting surface 32 of the first layer 30. The second layer 40 is located above the light emitting diodes 20 and wires 51, 52. The second layer 40 can be hemispherical shaped. The second layer 40 includes an adhesion surface 41 and a curved molding surface 42. The adhesion surface 41 is adhered on the supporting surface 32 of the first layer 30. The curved molding surface 42 is protruded backward from the substrate 10. The fluidity of colloid composing the first layer 30 is greater than the fluidity of colloid composing of the second layer 40.

Compared to traditional package structures, the light emitting diode package 100 in the present disclosure does not use a cofferdam structure to limit colloid overflow. So a height of the package member (the first layer 30 and the second layer 40) can be flexibly adjusted by controlling differences in fluidity and volume of colloid of the package member according to different requests. The height of the package member can even be higher than 0.5 mm. Thereof, a package structure with a relatively high height and a desired shape can be obtained. Because of the high height of the package member, the light emitting diode package 100 obtains a large light mixing distance, which can achieve better optical extraction efficiency.

Figure 2:
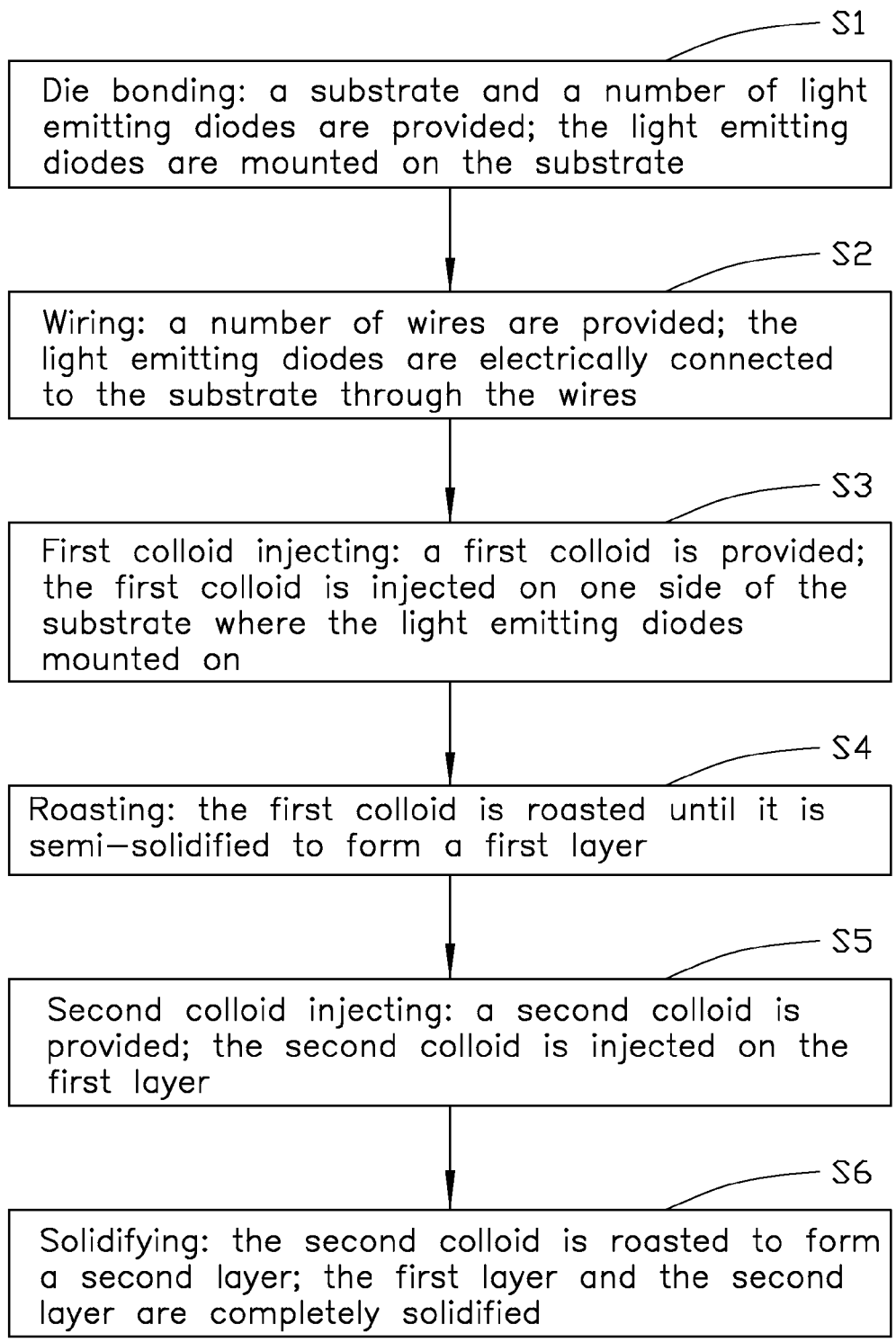
FIG. 2 is a flow chart of a method for manufacturing the light emitting diode package in FIG. 1.

A method for manufacturing a light emitting diode package 100 is also provided in the present disclosure. Referring to FIG. 2, the method of manufacturing the light emitting diode package 100 includes steps as following:

Step 1: die bonding. A substrate and a plurality of light emitting diodes are provided. The light emitting diodes are mounted on the substrate.

Step 2: wiring. A plurality of wires are provided. The light emitting diodes are electrically connected to the substrate through the wires.

Step 3: first colloid injecting. A first colloid is provided. The first colloid is injected on one side of the substrate where the light emitting diodes mounted on.

Step 4: roasting. The first colloid is roasted until it is semi-solidified to form a first layer.

Step 5: second colloid injecting. A second colloid is provided. The second colloid is injected on the first layer. The fluidity of the first colloid is greater than the fluidity of the second colloid.

Step 6: solidifying. The second colloid is roasted to form a second layer. The first layer and the second layer are completely solidified.

Figure 3:
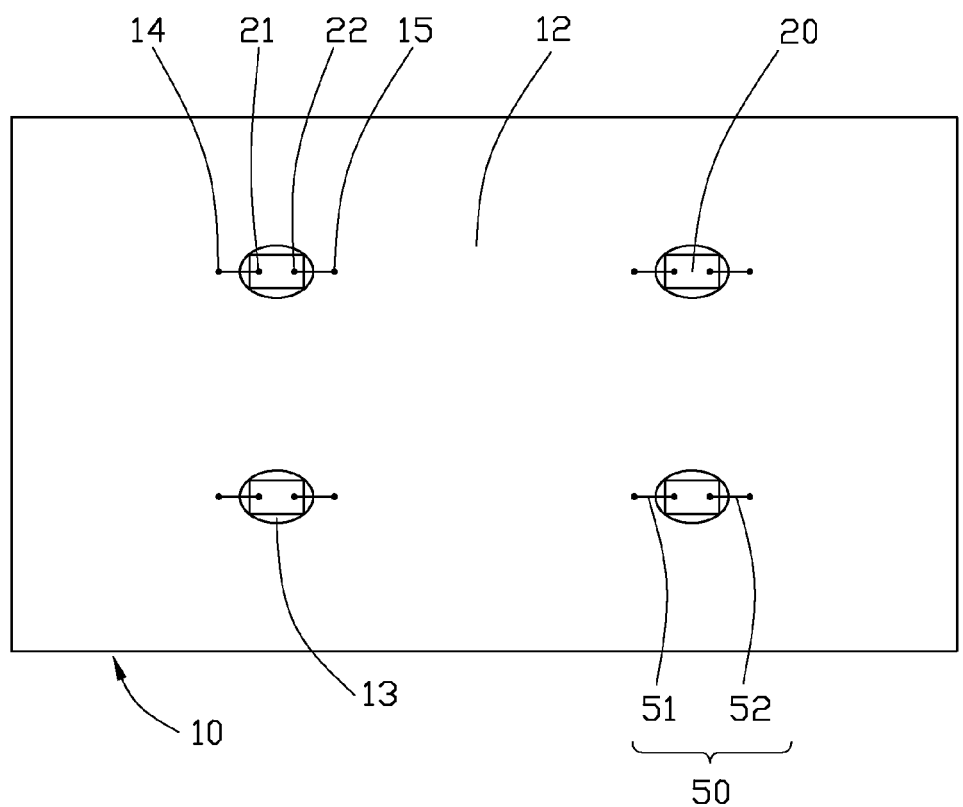
FIG. 3 is a top view of the light emitting diode package processed after a step of wiring in FIG. 2.

The detail steps of manufacturing the light emitting diode package 100 is described as following:

Referring to FIG. 3, a substrate 10 is provided. A plurality of bonding areas 13, first electrodes 14 and second electrodes 15 are configured on the top surface 12 of the substrate 10. A plurality of light emitting diodes 20 are provided. Each light emitting diode 20 is fixed on the substrate 10 with a process of die bonding. In this exemplary embodiment, die bonding is processed in a common way: the light emitting diodes 20 are positioned on a surface of a gum machine with a silver layer scraped; a right amount of sliver paste is pointed on the bonding areas 13 of the substrate 10; each light emitting diodes 20 is fixed on a corresponding bonding area 13 through a thorn crystal pen. Then the substrate 10 is put into a heat circulation oven to stand for a period of time and then is removed until the sliver paste solidified.

A plurality of wires 50 are provided. In this exemplary embodiment, the wires 50 are gold wires. The light emitting diodes 20 are electrically connected to the substrate 10 by a wire bonder.

Figure 4:
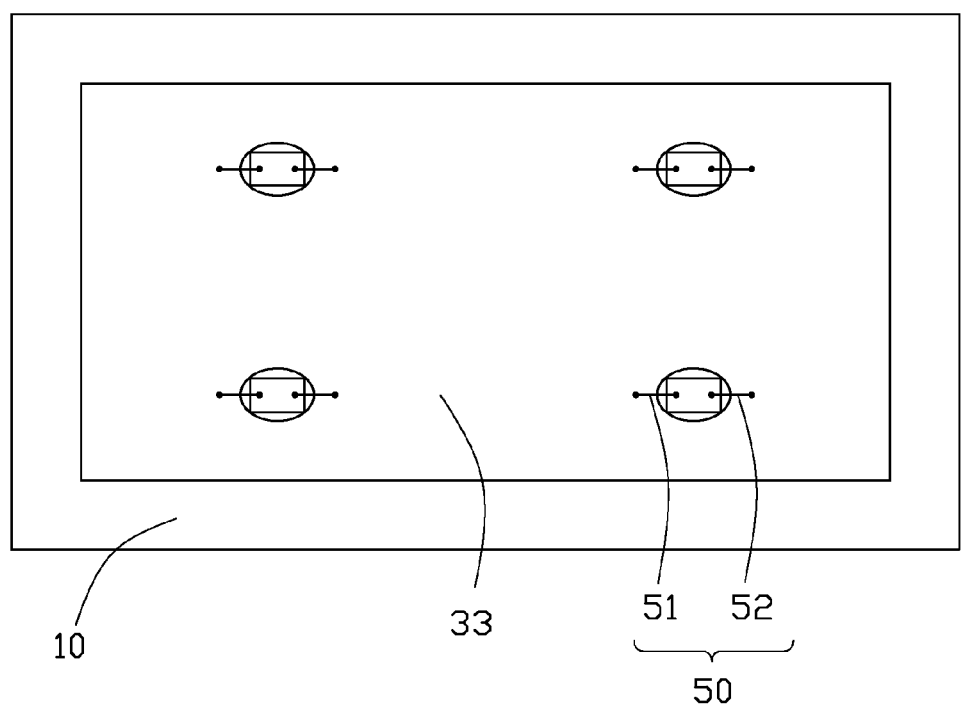
FIG. 4 is a top view of the light emitting diode package processed by a first colloid injection step in FIG. 2.

Referring to FIG. 4, a first colloid 33 is provided. The first colloid 33 is injected on the top surface 12. The first colloid 33 is spread on the top surface 12 and covers the light emitting diodes 20 and wires 50 completely. The substrate 10 is put into a heat circulation oven to stand for a period of time until the first colloid 33 is semi-solidified to form the first layer 30.

Figure 5:
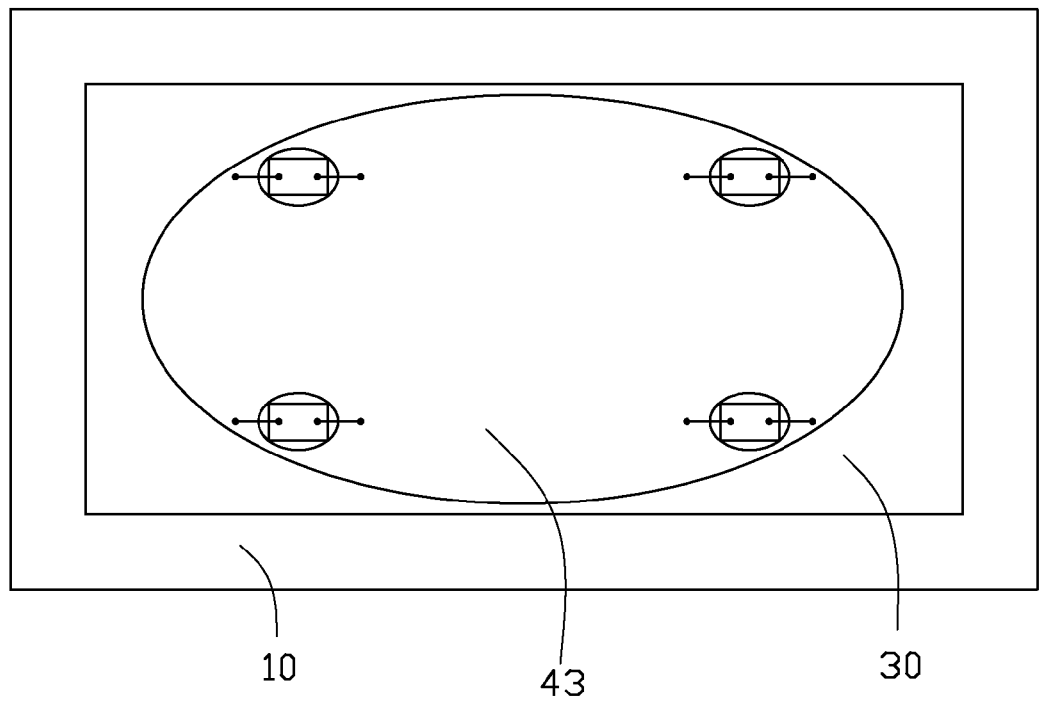
FIG. 5 is a top view of the light emitting diode package processed by a second colloid injection step in FIG. 2.

Referring to FIG. 5, a second colloid 43 is provided. The fluidity of the first colloid 33 is greater than the fluidity of the second colloid 43. The second colloid 43 is injected on the supporting surface 32 of the first layer 30. The substrate 10 is put into a heat circulation oven to stand for a period of time until the first layer 30 and the second colloid 43 are completely solidified. The second colloid 43 is solidified as a second layer 40 on the first layer 30. The second layer 40 is hemispherical.

In aforesaid processes, phosphor may also be doping in the first colloid 33 and the second colloid 43.

Kinds of the first colloid 33 and the second colloid 43 may be different. In this exemplary embodiment, the first colloid 33 and the second colloid 43 are the same and both of them are silica gel. But in this exemplary embodiment, viscosity coefficient of the first colloid 33 rages from 5000 to 6000 mpas and viscosity coefficient of the second colloid 43 is 3400 mpas. In other embodiments, the first colloid 33 and the second colloid 43 may also be other types of colloid.

In a process of the first colloid injection, because of greater fluidity, the first colloid 33 is spread on the top surface 12 of the substrate 10 more quickly and easily with covering the light emitting diodes 20 and wires 50.

In the process of the second colloid injection, when the second colloid 43 is injected on the first colloid 33, weight of the second colloid 43 is insufficient to overcome the flow-ability of the semi-solidified first colloid 33, thereof the supporting surface 32 of the first layer 30 remains flat. Herein, a solidification degree of the first colloid 33 can be adjusted by controlling solidification time. In this exemplary embodiment, the fluidity of the second colloid 43 is greater than the fluidity of the semi-solidified first layer 30. The second colloid 43 cannot destroy horizontality of the supporting surface 32 of the first layer 30. So the second colloid 43 does not fall into the inside of the first layer 30 or even contact the light emitting diodes 20 or wires 50, further with damaging the integrity of the structural. Because of lower fluidity, the second colloid 43 does not spread on the first layer 30, but be hemispherical under the effect of its cohesion. In other exemplary embodiments, the solidification time of roasting the first colloid 33 can be shortened, then the supporting surface 32 of the first layer 30 can be slightly recessed toward the substrate 10 to form a concave curved surface under the weight of the second colloid 43.

Colloid volume of the first colloid 33 and the second colloid 43 are quantificationally controlled by an injection machine, thereby maintaining consistency of the molding of the first layer 30 and the second layer 40.

Compared to traditional package structures, the light emitting diode package 100 in the present disclosure does not use a cofferdam structure to limit colloid overflow. The package member is formed under the worse mobility between two silica layers and cohesion of the silica layers. The step of configuring a cofferdam structure can be omitted in the manufacturing process, so that the production method is simpler.

The embodiment shown and described above is only an example. Many details are often found in the art such as the other features of the package members. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode package, comprising:
   a substrate;
   a plurality of light emitting diodes mounted on the substrate and electrically connected to the substrate; and
   a package member enveloping the light emitting diodes;
   the package member comprising two layers named a first layer and a second layer;
   the first layer being spread on the substrate and covering the light emitting diodes, the second layer being formed on the first layer; and
   fluidity of colloid composing the first layer being greater than fluidity of colloid composing the second layer.

2. The light emitting diode package of claim 1, wherein the substrate is a board with a conductive circuit.

3. The light emitting diode package of claim 2, wherein the substrate comprises a top surface for carrying the light emitting diodes.

4. The light emitting diode package of claim 3, wherein a plurality of bonding areas are formed on the top surface to fix the light emitting diodes.

5. The light emitting diode package of claim 1, wherein the first layer is formed on one side of the substrate where the light emitting diodes mounted on.

6. The light emitting diode package of claim 5, wherein the first layer comprises a pasting surface and a supporting surface, the pasting surface is attached on the substrate, and the second layer is formed on the supporting surface.

7. The light emitting diode package of claim 6, wherein the supporting surface is flat.

8. The light emitting diode package of claim 6, wherein the second layer is located above the light emitting diodes.

9. The light emitting diode package of claim 8, wherein the second layer is hemispherical shaped.

10. The light emitting diode package of claim 9, the second layer comprises an adhesion surface and a curved molding surface, the adhesion surface is adhered on the supporting surface of the first layer, the curved molding surface is protruded backward from the substrate.

11. A method of for manufacturing a light emitting diode package, comprising:
   providing a substrate and a plurality of light emitting diodes, the light emitting diodes being mounted on the substrate;
   providing a plurality of wires, the light emitting diodes being electrically connected to the substrate through the wires;
   providing a first colloid, the first colloid being injected on one side of the substrate where the light emitting diodes mounted on;
   roasting the first colloid until semi-solidified to form a first layer;
   providing a second colloid, the second colloid being injected on the first layer, fluidity of the first colloid being greater than fluidity of the second colloid;
   roasting the second colloid to form a second layer; the first layer and the second layer being completely solidified.

12. The method for manufacturing a light emitting diode package of claim 11, wherein the substrate is a board with a conductive circuit.

13. The method for manufacturing a light emitting diode package of claim 11, wherein the substrate comprises a top surface, a plurality of bonding areas are formed on the top surface, and the light emitting diodes are fixed on the bonding areas.

14. The method for manufacturing a light emitting diode package of claim 13, wherein the first colloid is injected on the top surface to form the first layer, and the first colloid covers the light emitting diodes and wires.

15. The method for manufacturing a light emitting diode package of claim 14, wherein the first layer comprises a supporting surface; the second colloid is injected on the supporting surface of the first layer.

16. The method for manufacturing a light emitting diode package of claim 15, wherein the supporting surface is flat.

17. The method for manufacturing a light emitting diode package of claim 16, the second layer is hemispherical shaped.

18. The method for manufacturing a light emitting diode package of claim 11, wherein the fluidity of the second colloid is greater than the fluidity of the semi-solidified first layer.

19. The method for manufacturing a light emitting diode package of claim 18, wherein the viscosity coefficient of the second colloid is 3400 mpas.

20. The method for manufacturing a light emitting diode package of claim 11, wherein the viscosity coefficient of the first colloid rages from 5000 to 6000 mpas.

* * * * *